(12) United States Patent
Huang et al.

(10) Patent No.: US 8,074,013 B2
(45) Date of Patent: Dec. 6, 2011

(54) UNIFORM CODING SYSTEM FOR A FLASH MEMORY

(75) Inventors: Han-Lung Huang, Hsinchu (TW);
Chien-Fu Huang, Hsinchu (TW);
Ming-Hung Chou, Hsinchu (TW);
Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 320 days.

(21) Appl. No.: 12/563,915

(22) Filed: Sep. 21, 2009

(65) Prior Publication Data

US 2011/0072191 A1    Mar. 24, 2011

(51) Int. Cl.
*G06F 13/00* (2006.01)
(52) U.S. Cl. .................... 711/103; 711/E12.001

(58) Field of Classification Search ............ 365/185.33, 365/185.01; 711/103, E12.001, E12.008
See application file for complete search history.

(56) References Cited

U.S. PATENT DOCUMENTS

| | | | |
|---|---|---|---|
| 3,806,810 A * | 4/1974 | Widmer et al. ............. 375/242 |
| 2007/0089034 A1 | 4/2007 | Litsyn et al. |
| 2008/0282106 A1 | 11/2008 | Shalvi et al. |

* cited by examiner

*Primary Examiner* — Vu Le
(74) *Attorney, Agent, or Firm* — Squire, Sanders & Dempsey US (LLP)

(57) ABSTRACT

A uniform coding system for a flash memory is disclosed. A statistic decision unit determines a coding word according to a plurality of inputs. An inverse unit controllably inverts input data to be encoded. The input data are then encoded into encoded data according to a statistic determined by the statistic decision unit.

24 Claims, 6 Drawing Sheets

UNIFORM CODING SYSTEM FOR A FLASH MEMORY

BACKGROUND OF THE INVENTION

1. Field of the Invention

The present invention generally relates to a flash memory, and more particularly to uniform coding for a multi-level cell (MLC) flash memory.

2. Description of the Prior Art

Flash memory is a non-volatile solid state memory device that can be electrically erased and reprogrammed, and is a specific type of electrically erasable programmable read-only memory (EEPROM) device. Conventional flash memory stores a single bit of information in each memory cell such that each memory cell can be programmed to assume two possible states. The conventional flash memory is thus commonly referred to as single-level cell (SLC) flash memory or single-bit cell (SBC) flash memory. Modern flash memory is capable of storing two or more bits of information in each memory cell such that each memory cell can be programmed to assume more than two possible states. The modern flash memory is thus commonly referred to as multi-level cell (MLC) flash memory or multi-bit cell (MBC) flash memory.

Figure 1A:
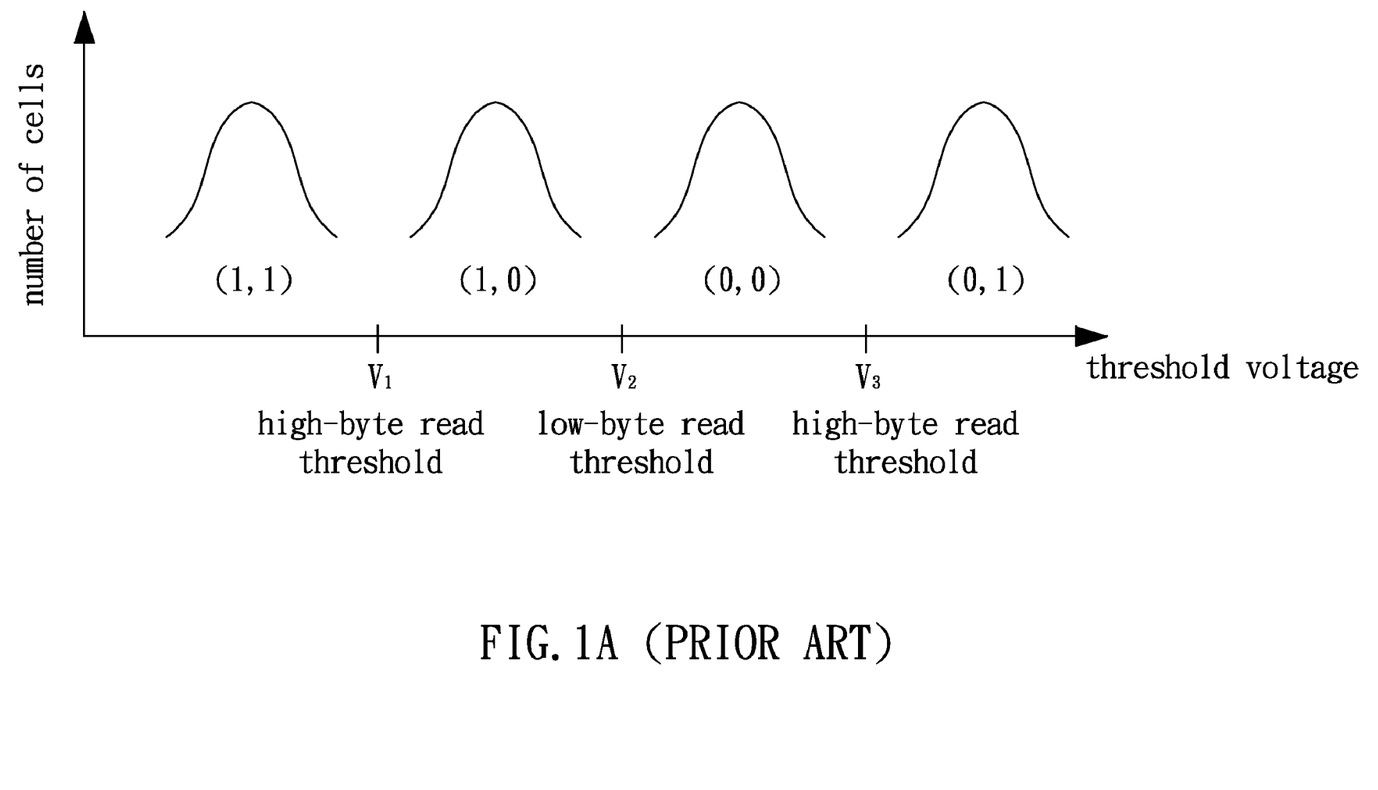
FIG. 1A shows a common distribution of the threshold voltage for a typical MLC flash memory.

In the flash memory, data of different state are written to the flash memory (which is commonly referred as programming the flash memory) by storing different amount of charge in the floating gate of the flash memory. As the charge in the floating gate specifically determines the corresponding threshold voltage, the data can then be read from the flash memory according to their different threshold voltage. Due to variations among the memory cells during the manufacture, operation or according to other factors, the threshold voltage of each state is not a constant value but a range. FIG. 1A shows a common distribution of the threshold voltage for a typical MLC flash memory (a two-bit cell flash memory is exemplified here). The entire voltage range is divided into a number of regions (e.g., four regions in the example), each region corresponding to one state. The number of cells of each threshold voltage is collected as illustrated. When the flash memory is being read, the threshold voltage of a cell is compared to reference voltages or read thresholds (e.g., $V_1$, $V_2$ and $V_3$ in the figure) to determine its state. Specifically, the threshold voltage is firstly compared with a low-byte read threshold (e.g., $V_2$ in the exemplary figure), followed by subsequently comparing with high-byte read thresholds (e.g., $V_1$ and $V_3$ in the exemplary figure).

Figure 1B:
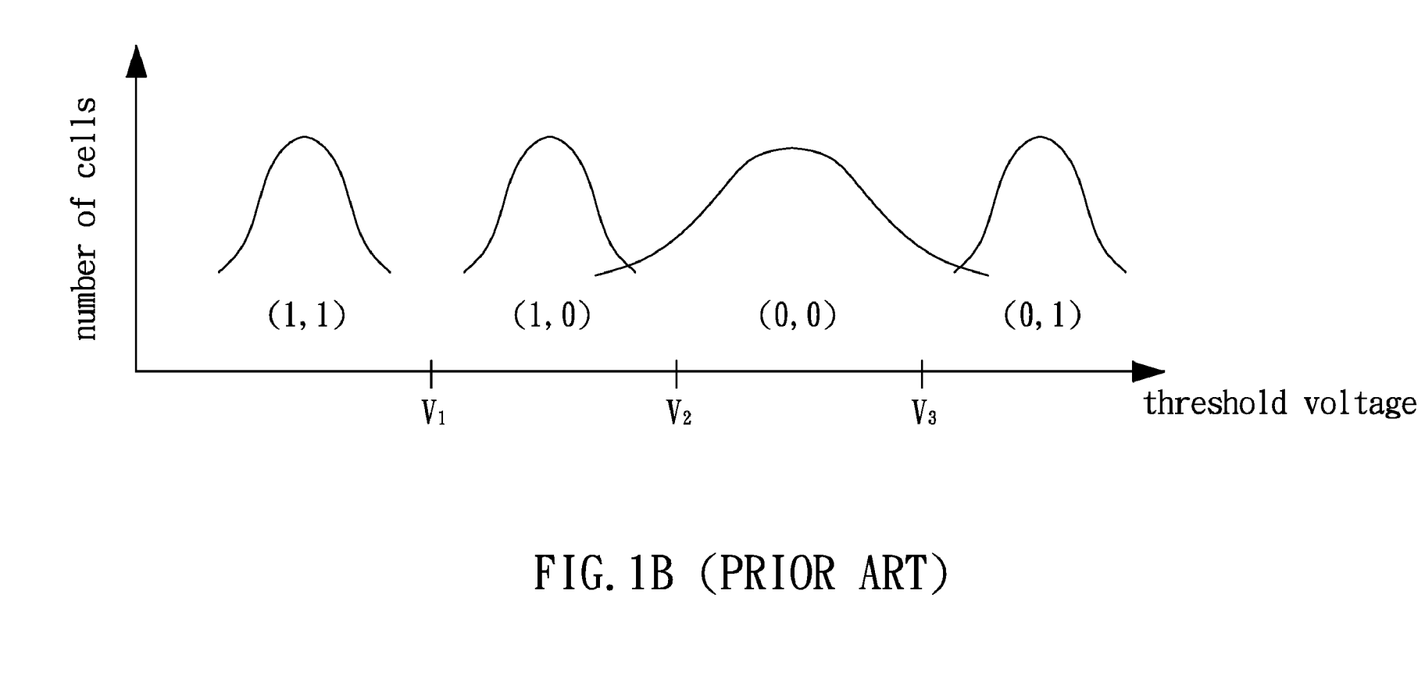
FIG. 1B shows a threshold distribution with a widened state.

However, partial distribution of threshold voltages may become widened, such as the state (0,0) shown in FIG. 1B, when the low-byte data and the high-byte data in the same word line have substantially the same value. As a result, the read margin decreases and error rate increases.

For the reason that conventional flash memory, particularly the MLC flash memory, could probably result in read errors due to widened distribution of threshold voltages of one or more states, a need has arisen to propose some novel schemes to cause the threshold voltages more uniformly distributed.

SUMMARY OF THE INVENTION

In view of the foregoing, it is an object of the embodiments to provide uniform coding for a flash memory in order to prevent threshold distribution widening due to non-uniform data stored in the flash memory.

According to a first embodiment, a data divider divides a data section of input data into multiple data parts. A statistic decision unit determines a coding word according to the data parts. The statistic decision unit performs following steps on the data parts: counting to derive a counted number of bits "0" or bits "1" in each of the data parts; determining deviations of the counted number and a predetermined mean for the data parts respectively; and determining one or more of the data parts that need be inverted such that a sum of the deviations approaches zero, wherein inversion and non-inversion of the data parts collectively generate the coding word. An inverse unit inverts bits of the data part or parts that need be inverted, while the other data part or parts remain unchanged, thereby resulting in encoded data.

According to a second embodiment, an inverse unit controllably inverts input data to be encoded, wherein the inverse unit subjects the input data to exclusive-OR logical operation with multiple candidate words (or pseudo random numbers) respectively, thereby resulting in a plurality of exclusive-ORed input data. A statistic decision unit determines a coding word according to the multiple exclusive-ORed input data. The statistic decision unit performs following steps: counting bits "0" and bits "1" for each of the exclusive-ORed input data; and selecting the candidate word corresponding to the exclusive-ORed input data having approximately equal bits "0" and bits "1" as the coding word, and the associated exclusive-ORed input data as encoded data.

According to a third embodiment, a statistic decision unit determines a coding word according to input data The statistic decision unit performs following steps on the input data: determining occurring probabilities of data code combinations respectively; ranking the probabilities; and assigning more uniform code word to the data code combination with higher probability, and assigning less uniform code word to the data code combination with less probability, wherein the data code combinations and the associated code words therefore result in a probability coding table. An inverse unit controllably inverts at least part of the input data according to the associated code word as the coding word, thereby resulting in the encoded data.

DETAILED DESCRIPTION OF THE INVENTION

Figure 2:
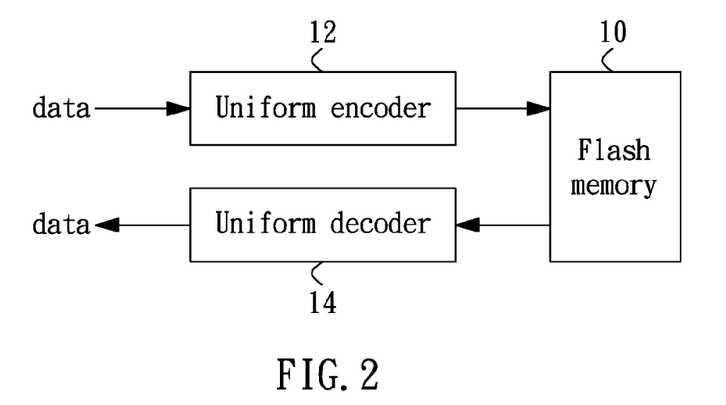
FIG. 2 is a block diagram that illustrates a uniform coding system for a flash memory according to one embodiment of the present invention.

FIG. 2 is a block diagram that illustrates a uniform coding system for a flash memory 10 according to one embodiment of the present invention. Although a multi-level cell (MLC) flash memory is illustrated in the embodiment, the present embodiment, however, may be adapted to a single-level cell (SLC) flash memory as well. It is appreciated that each block of the uniform coding system in the embodiment may be implemented by hardware such as circuitry or by software or their combination.

In the embodiment, before data are written (or programmed) to the flash memory 10, the data are uniformly encoded by a uniform encoder 12 such that the bits "0" and "1" of the encoded data may be uniformly distributed accordingly. In other words, the number of bits "0" in a page or a word line, for example, may be substantially equal to the number of bits "1" in the same page or word line. Furthermore, the bits "0" may be evenly scattered in the page or word line, and the bits "1" may be evenly scattered in the same page or word line. With respect to, for example, a 2-bit MLC flash memory, low-byte data (i.e., the data firstly programmed into the 2-bit MLC flash memory 10) as well as high-byte data (i.e., the data secondly or subsequently programmed into the 2-bit MLC flash memory 10) may be uniformly encoded by the uniform encoder 12. When the (encoded) data are read from the flash memory 10, the (encoded) data are uniformly decoded by a uniform decoder 14 that applies an inverse of the encoding operation performed in the uniform encoder 12, such that the original data may be faithfully recovered.

Figure 3A:
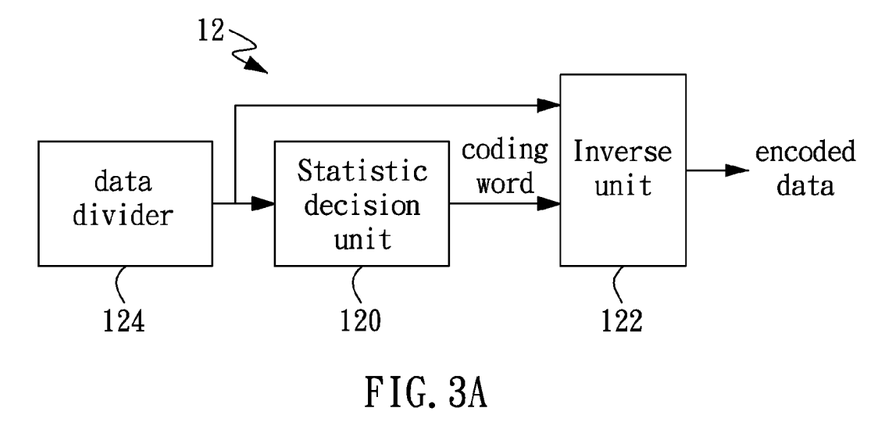
FIG. 3A shows a detailed block diagram of the uniform encoder of FIG. 2 according to a first embodiment of the present invention.

FIG. 3A shows a detailed block diagram of the uniform encoder 12 of FIG. 2 according to a first embodiment of the present invention. In the embodiment, the uniform encoder 12 primarily includes a statistic decision unit 120 and an inverse unit 122. Before the data are forwarded to the statistic decision unit 120, the data are divided, by a data divider 124, into multiple parts (e.g., part 1 to part 8) that are preferably equal or approximately equal in size. Table 1 shows one exemplary 512-byte section of low-byte data that is divided into eight parts each having 512 bits in size. It is appreciated that the size of the data section and the number of the data parts shown here are for illustration purpose only. Generally speaking, smaller size of the data section or/and larger number of the data parts leads to more uniformity in the coding.

Subsequently, the low-byte data are forwarded to the statistic decision unit 120, which counts to derive the number of bits "0" (or counts to derive the number of bits "1" in other embodiment) in each part, for example, by a counter (not shown). Next, deviations (i.e., the difference between the counted numbers and an ideal (or predetermined) mean, e.g., 256 (or 512/2) in this example) for each data part are calculated respectively. The deviations are then summed up. As shown in Table 1, the positive value, 48, of the sum of deviations indicates that there are more bits "0" than bits "1" in the whole data section.

Thereafter, the inverse unit 122 inverts the bits of one or more data parts according to the result of the statistic decision unit 120, such that the sum of deviations becomes or approaches zero, therefore uniformly distributing the bits "0" and "1" in the encoded data. In the example illustrated in Table 1, all the bits in the part 1 and all the bits in the part 5 are inverted (that is, bits "0" are changed to "1" and bits "1" are changed to "0") while the other parts remain unchanged. The result of the statistic decision unit 120 is also outputted as a coding word that may be used later in a decoding operation. In the example, one index bit is reserved for one data part to indicate whether the associated data part has been inverted ("0") or has not been inverted ("1"). It is noted that the size of the coding "word" in the specification may be any length as required.

The coding operation described above may be applied to the high-byte data as well. It is noted that, with respect to each data part, a deviation between the counted number of "0,1" and the ideal mean (e.g., 128) is subtracted from another deviation between the counted number of "0,0" and an ideal mean (e.g., 128). In the example illustrated in Table 2, all the bits in the part 2 and all the bits in the part 5 are inverted while the other parts remain unchanged, such that the sum of deviations becomes or approaches zero, therefore uniformly distributing the bits "0" and "1" in the encoded high-byte data. Further, the statistic decision unit 120 also outputs another coding word that may be used later in decoding the high-byte data. In the example, one index bit is reserved for one data part to indicate whether the associated data part has been inverted ("0") or has not been inverted ("1").

TABLE 1

| part | 1 | 2 | 3 | 4 | 5 | 6 | 7 | 8 |
|---|---|---|---|---|---|---|---|---|
| size | 512 bits | 512 bits | 512 bits | 512 bits | 512 bits | 512 bits | 512 bits | 512 bits |
| count of "0" | 270 | 265 | 253 | 261 | 266 | 259 | 247 | 275 |
| deviation (i.e., count-256) | 14 | 9 | −3 | 5 | 10 | 3 | −9 | 19 |
| sum of deviations | | | | | 48 | | | |
| deviation after inverse | -14 | 9 | −3 | 5 | -10 | 3 | −9 | 19 |
| New sum of deviations | | | | | 0 | | | |
| coding bit | 0 | 1 | 1 | 1 | 0 | 1 | 1 | 1 |

TABLE 2

| part | 1 | 2 | 3 | 4 | 5 | 6 | 7 | 8 |
|---|---|---|---|---|---|---|---|---|
| size of low-byte | 512 bits | 512 bits | 512 bits | 512 bits | 512 bits | 512 bits | 512 bits | 512 bits |
| size of high-byte | 512 bits | 512 bits | 512 bits | 512 bits | 512 bits | 512 bits | 512 bits | 512 bits |
| deviation (i.e., count of ("0, 0"-128) − ("0, 1"-128)) | 9 | 13 | −3 | 5 | 10 | 2 | 18 | −8 |
| sum of deviations | | | | | 46 | | | |
| deviation after inverse | 9 | -13 | −3 | 5 | -10 | 2 | 18 | −8 |
| New sum of deviations | | | | | 0 | | | |
| coding bit | 1 | 0 | 1 | 1 | 0 | 1 | 1 | 1 |

Figure 3B:
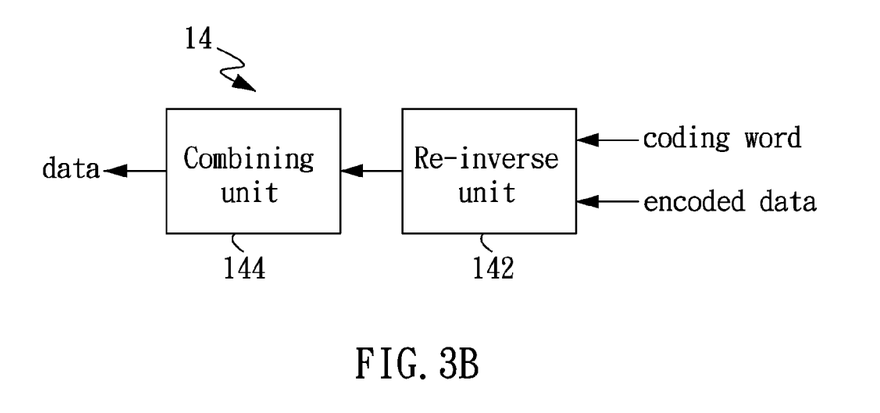
FIG. 3B shows a detailed block diagram of the uniform decoder of FIG. 2 according to the first embodiment of the present invention.

FIG. 3B shows a detailed block diagram of the uniform decoder 14 of FIG. 2 according to the first embodiment of the present invention. In the embodiment, the uniform decoder 14 primarily includes a re-inverse unit 142 that inverts the bits of each data part again according to the associated bit of the coding word. For example, the bits of the data part or parts are inverted again if the associated bit of the coding word is "0", and the other data parts remain unchanged if the associated bit of the coding word is "1". Subsequently, the outputs of the data parts from the re-inverse unit 142 are combined by a combining unit 144 to form an entire data section.

Figure 4A:
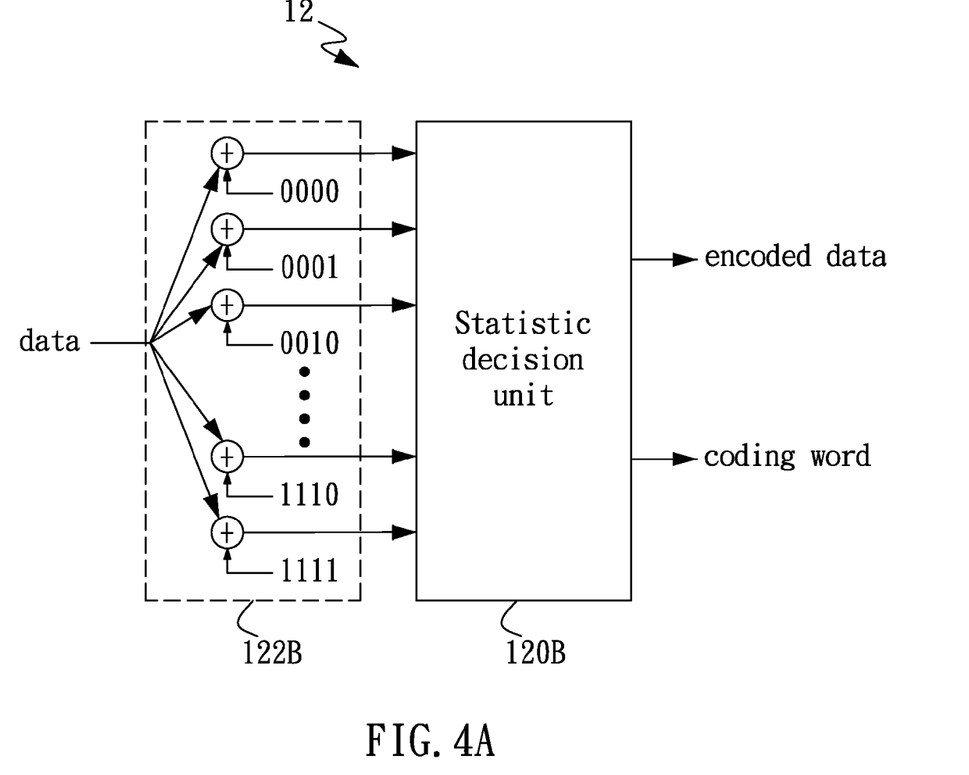
FIG. 4A shows a detailed block diagram of the uniform encoder of FIG. 2 according to a second embodiment of the present invention.

FIG. 4A shows a detailed block diagram of the uniform encoder 12 of FIG. 2 according to a second embodiment of the present invention. The uniform encoder 12 primarily includes an inverse unit 122B and a statistic decision unit 120B. In the exemplary embodiment, four bits of the data are processed by the inverse unit 122B at a time. Specifically, the data bits are subjected to exclusive-OR (XOR or designated as ⊕) logical operation with (candidate) coding word (e.g., 0000, 0001, 0010 . . . or 1111 in the example). It is appreciated that the set of coding words need not be complete, and the number of coding bits in each coding word is not limited to four. Generally speaking, more coding words lead to more uniformity in the coding. Table 3 shows an XOR truth table of the data bit and the coding bit.

TABLE 3

| original data bit | coding bit | encoded data bit (XOR) | |
|---|---|---|---|
| 0 | 0 | 0 | data bit unchanged |
| 1 | 0 | 1 | |
| 0 | 1 | 1 | data bit inverted |
| 1 | 1 | 0 | |

In the embodiment, the data bit is inverted when the corresponding coding bit is logic "1", and the data bit remains unchanged when the corresponding coding bit is logic "0". Although the data bits are exclusive-ORed with the coding words in parallel in this example, it is appreciated that the logical operations XOR may be performed in sequence in other embodiment.

The outputs of the inverse unit 122B are forwarded to the statistic decision unit 120B, which counts, for example, by a counter (not shown), to derive the number of bits "1" (or the bits "0") of each output of the inverse unit 122B. The statistic decision unit 120B then determines one of the candidate coding words as the coding word based on the corresponding optimal output of the inverse unit 122B. For example, the output with equal number of bits "0" and the bits "1" is regarded as the optimal output in the embodiment. The coding operation described above may be applied to the high-byte data as well as the low-byte data.

Figure 4B:
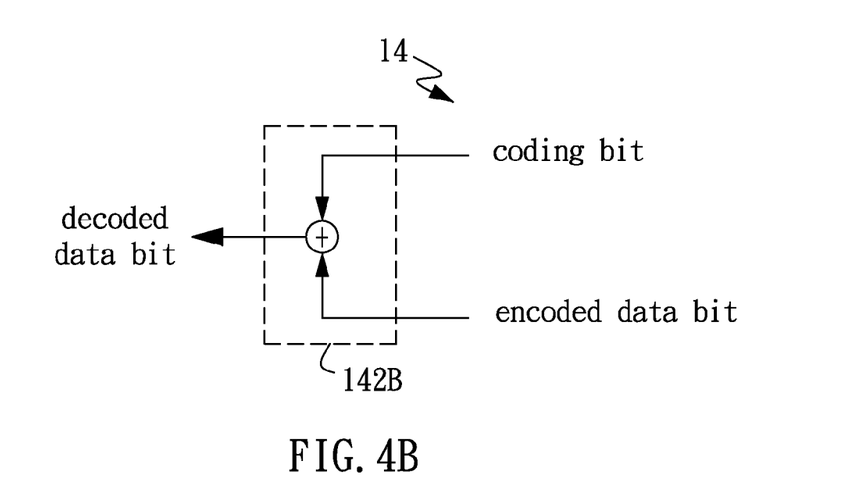
FIG. 4B shows a detailed diagram of the uniform decoder of FIG. 2 according to the second embodiment of the present invention.

FIG. 4B shows a detailed diagram of the uniform decoder 14 of FIG. 2 according to the second embodiment of the present invention. In the embodiment, the uniform decoder 14 primarily includes a re-inverse unit 142B that inverts the data bits according to the associated coding bit. For example, the re-inverse unit 142B in the embodiment includes a logic XOR operation performed on the coding bit and the encoded data bit, thereby resulting in the decoded data bit, as shown in Table 4, that is equal to the original data bit.

TABLE 4

| encoded data bit | coding bit | decoded data bit (XOR) |
|---|---|---|
| 0 | 0 | 0 |
| 0 | 1 | 1 |
| 1 | 0 | 1 |
| 1 | 1 | 0 |

Figure 5:
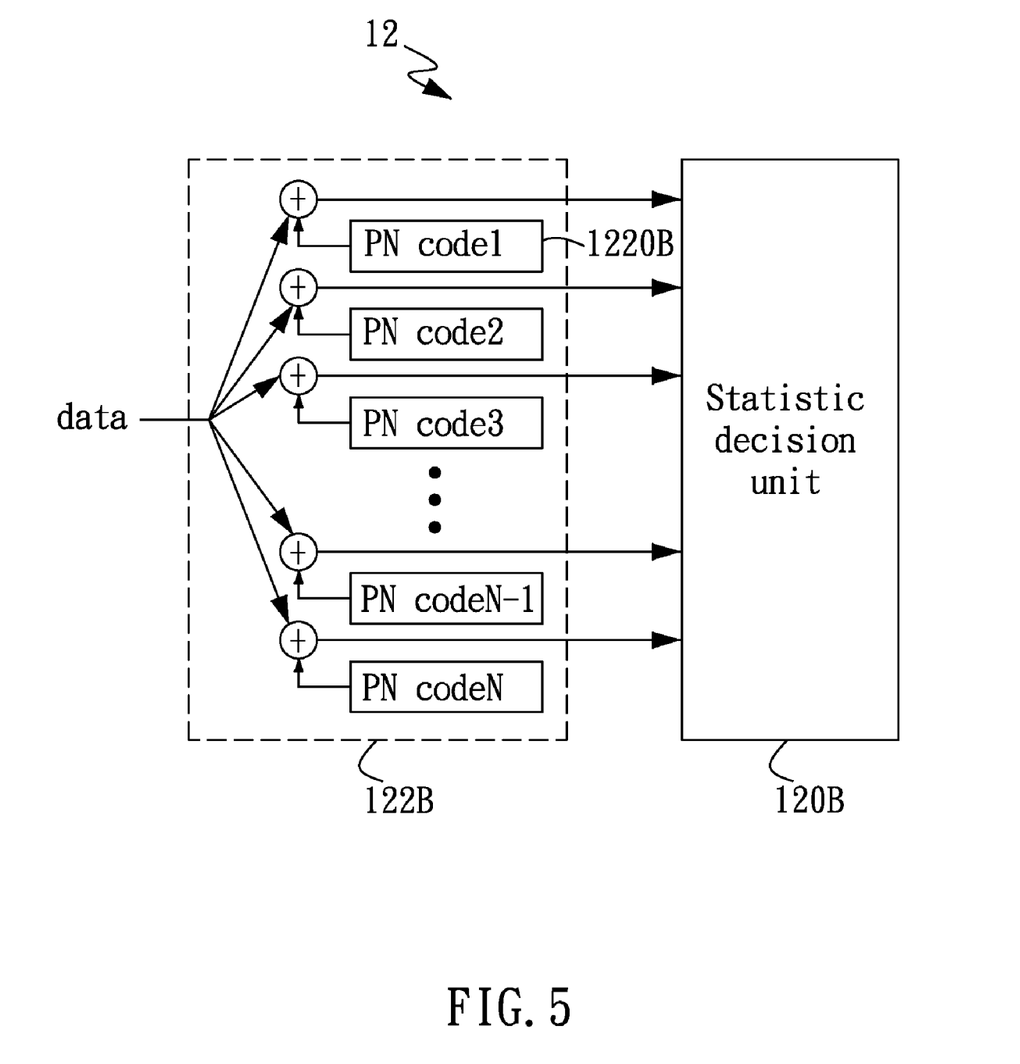
FIG. 5 shows a detailed block diagram of the uniform encoder of FIG. 2 according to an alternative second embodiment of the present invention.

FIG. 5 shows a detailed block diagram of the uniform encoder 12 of FIG. 2 according to an alternative second embodiment of the present invention. In the embodiment, the candidate coding words in FIG. 3A is now replaced with pseudo-random number (PN) codes generated by pseudo random dom number generators 1220B respectively. It is appreciated that the set of coding words (i.e., the PN codes) need not be complete, and the number of coding bits in each coding word may be any length as required. Generally speaking, more coding words lead to more uniformity in the coding.

Figure 6A:
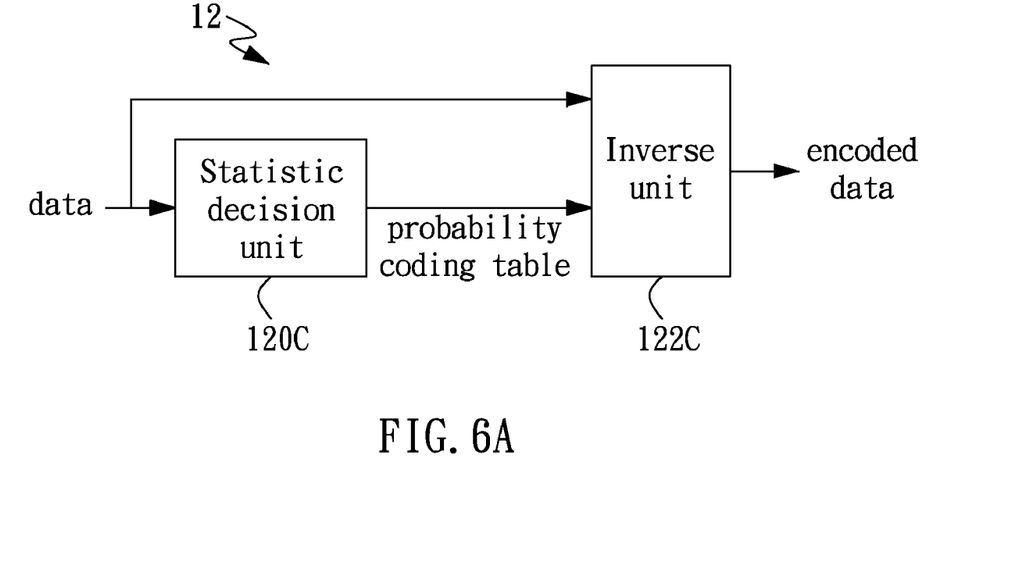
FIG. 6A shows a detailed block diagram of the uniform encoder of FIG. 2 according to a third embodiment of the present invention.
Figure 6B:
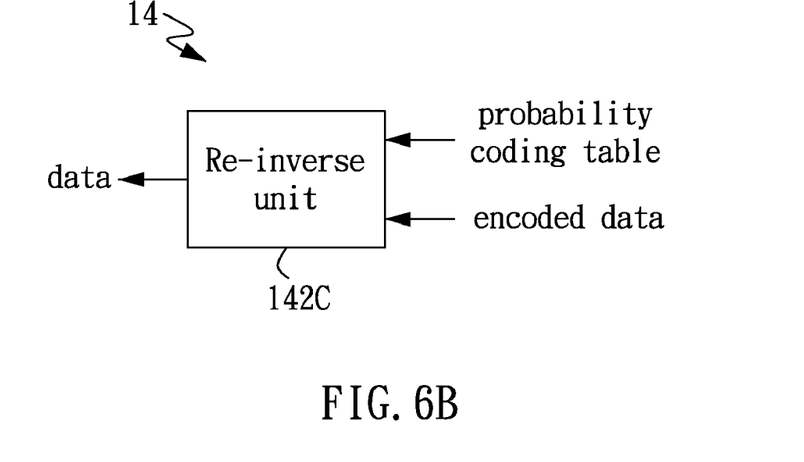
FIG. 6B shows a detailed block diagram of the uniform decoder of FIG. 2 according to the third embodiment of the present invention.

FIG. 6A shows a detailed block diagram of the uniform encoder 12 of FIG. 2 according to a third embodiment of the present invention. The uniform encoder 12 primarily includes a statistic decision unit 120C and an inverse unit 122C. In the exemplary embodiment, the statistic decision unit 120C determines the occurring frequency or probability of each data code combination. After the data codes are ranked according to their respective probabilities as shown in Table 5, the data code with higher probability are encoded with more uniform code, and vice versa, thereby resulting in a probability coding table. For example, as shown in Table 5, the data code "0110" with the highest probability is encoded as highly uniform code "0101" while the data code "0000" with least probability is encoded as least uniform code "1111". The inverse unit 122C then inverts the data bits, when necessary, according to the probability coding table. FIG. 6B shows a detailed block diagram of the uniform decoder 14 of FIG. 2 according to the third embodiment of the present invention. In the embodiment, the uniform decoder 14 primarily includes a re-inverse unit 142C that inverts the encoded data bits, when necessary, according to the probability coding table shown in Table 5. For example, encoded data bits "0001" is decoded as "1011" according to the probability coding table.

TABLE 5

| original code | probability | rank | encoding |
|---|---|---|---|
| 0110 | 0.12 | 1 | 0101 |
| 0111 | 0.11 | 2 | 1010 |
| 0011 | 0.10 | 3 | 0011 |
| 1100 | 0.09 | 4 | 0110 |
| 0101 | 0.08 | 5 | 1001 |
| 1010 | 0.08 | 6 | 1100 |
| 1011 | 0.07 | 7 | 0001 |
| 0100 | 0.06 | 8 | 1110 |
| 1000 | 0.05 | 9 | 0100 |
| 1001 | 0.05 | 10 | 1011 |
| 1110 | 0.05 | 11 | 0010 |
| 1111 | 0.05 | 12 | 1101 |
| 0010 | 0.03 | 13 | 0111 |
| 1101 | 0.03 | 14 | 1000 |
| 0001 | 0.02 | 15 | 0000 |
| 0000 | 0.01 | 16 | 1111 |
| | 1.00 | | |

Although specific embodiments have been illustrated and described, it will be appreciated by those skilled in the art that various modifications may be made without departing from the scope of the present invention, which is intended to be limited solely by the appended claims.

What is claimed is:

1. A uniform coding system for a flash memory, comprising:
    a statistic decision unit for determining a coding word according to a plurality of inputs; and
    an inverse unit for controllably inverting input data to be encoded;
    wherein the input data are encoded into encoded data according to a statistic determined by the statistic decision unit.

2. The system of claim 1, further comprising a re-inverse unit for recovering the input data from the encoded data according to the coding word.

3. The system of claim 2, further comprising a data divider for dividing a data section of the input data into a plurality of data parts.

4. The system of claim 3, wherein the statistic decision unit performs following steps on the data parts:
counting to derive a counted number of bits "0" or bits "1" in each of the data parts;
determining deviations of the counted number and a predetermined mean for the data parts respectively; and
determining one or more of the data parts that need be inverted such that a sum of the deviations approaches zero;
wherein inversion and non-inversion of the data parts collectively generate the coding word.

5. The system of claim 4, wherein the inverse unit inverts bits of the data part or parts that need be inverted, while the other data part or parts remain unchanged, thereby resulting in the encoded data.

6. The system of claim 5, wherein the re-inverse unit inverts the bits of the data part or parts of the encoded data that have been inverted, while the other data part or parts remain unchanged, thereby recoverably decoding the encoded data into the input data.

7. The system of claim 6, further comprising a combing unit for combining the data parts from the re-inverse unit, thereby forming the entire data section.

8. The system of claim 2, wherein the inverse unit subjects the input data to exclusive-OR logical operation with a plurality of candidate words respectively, thereby resulting in a plurality of exclusive-ORed input data.

9. The system of claim 8, wherein the statistic decision unit performs following steps:
counting bits "0" and bits "1" for each of the exclusive-ORed input data; and
selecting the candidate word corresponding to the exclusive-ORed input data having approximately equal bits "0" and bits "1" as the coding word, and the associated exclusive-ORed input data as the encoded data.

10. The system of claim 9, wherein the re-inverse unit subjects the encoded data to a further exclusive-OR logical operation with the coding word, thereby recoverably decoding the encoded data into the input data.

11. The system of claim 8, wherein each of the plurality of candidate words is a pseudo random number.

12. The system of claim 11, further comprising at least one pseudo random number generator for generating the pseudo random number.

13. The system of claim 2, wherein the statistic decision unit performs following steps on the input data:
determining occurring probabilities of data code combinations respectively;
ranking the probabilities; and
assigning more uniform code word to the data code combination with higher probability, and assigning less uniform code word to the data code combination with less probability;
wherein the data code combinations and the associated code words therefore result in a probability coding table.

14. The system of claim 13, wherein the inverse unit controllably inverts at least part of the input data according to the associated code word as the coding word, thereby resulting in the encoded data.

15. The system of claim 14, wherein the re-inverse unit controllably inverts at least part of the encoded data according to the probability coding table, thereby recoverably decoding the encoded data into the input data.

16. A uniform coding system for a flash memory, comprising:
a data divider for dividing a data section of input data into a plurality of data parts;
a statistic decision unit for determining a coding word according to the data parts, wherein the statistic decision unit performs following steps on the data parts:
counting to derive a counted number of bits "0" or bits "1" in each of the data parts;
determining deviations of the counted number and a predetermined mean for the data parts respectively; and
determining one or more of the data parts that need be inverted such that a sum of the deviations approaches zero, wherein inversion and non-inversion of the data parts collectively generate the coding word; and
an inverse unit for inverting bits of the data part or parts that need be inverted, while the other data part or parts remain unchanged, thereby resulting in encoded data.

17. The system of claim 16, further comprising:
a re-inverse unit for recovering the input data from the encoded data according to the coding word; and
a combing unit for combining the data parts from the re-inverse unit, thereby forming the entire data section.

18. The system of claim 17, wherein the re-inverse unit inverts the bits of the data part or parts of the encoded data that have been inverted, while the other data part or parts remain unchanged, thereby recoverably decoding the encoded data into the input data.

19. A uniform coding system for a flash memory, comprising:
an inverse unit for controllably inverting input data to be encoded, wherein the inverse unit subjects the input data to exclusive-OR logical operation with a plurality of candidate words respectively, thereby resulting in a plurality of exclusive-ORed input data; and
a statistic decision unit for determining a coding word according to the plurality of exclusive-ORed input data, wherein the statistic decision unit performs following steps:
counting bits "0" and bits "1" for each of the exclusive-ORed input data; and
selecting the candidate word corresponding to the exclusive-ORed input data having approximately equal bits "0" and bits "1" as the coding word, and the associated exclusive-ORed input data as encoded data.

20. The system of claim 19, further comprising:
a re-inverse unit for subjecting the encoded data to a further exclusive-OR logical operation with the coding word, thereby recoverably decoding the encoded data into the input data.

21. The system of claim 19, wherein each of the plurality of candidate words is a pseudo random number.

22. The system of claim 21, further comprising at least one pseudo random number generator for generating the pseudo random number.

23. A uniform coding system for a flash memory, comprising:
a statistic decision unit for determining a coding word according to input data, wherein the statistic decision unit performs following steps on the input data:
determining occurring probabilities of data code combinations respectively;
ranking the probabilities; and assigning more uniform code word to the data code combination with higher probability, and assigning less uniform code word to the data code combination with less probability, wherein the data code combinations and the associated code words therefore result in a probability coding table; and an inverse unit for controllably inverting at least part of the input data according to the associated code word as the coding word, thereby resulting in the encoded data.

24. The system of claim 23, further comprising:

a re-inverse unit for controllably inverting at least part of the encoded data according to the probability coding table, thereby recoverably decoding the encoded data into the input data.

* * * * *